United States Patent
Sakaguchi et al.

(10) Patent No.: US 7,829,451 B2
(45) Date of Patent: Nov. 9, 2010

(54) CONDUCTIVE BALL MOUNTING METHOD AND APPARATUS HAVING A MOVABLE SOLDER BALL CONTAINER

(75) Inventors: Hideaki Sakaguchi, Nagano (JP); Kiyoaki Iida, Nagano (JP); Kazuo Tanaka, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 75 days.

(21) Appl. No.: 12/174,879

(22) Filed: Jul. 17, 2008

(65) Prior Publication Data

US 2009/0023282 A1    Jan. 22, 2009

(30) Foreign Application Priority Data

Jul. 18, 2007  (JP) .............................. 2007-187229
Jul. 9, 2008   (JP) .............................. 2008-179477

(51) Int. Cl.
    *H01L 21/44*   (2006.01)
(52) U.S. Cl. ................ 438/612; 438/613; 257/E21.476
(58) Field of Classification Search ......... 438/612–614; 257/E21.476
    See application file for complete search history.

(56) References Cited

U.S. PATENT DOCUMENTS

| 6,533,159 | B1 | 3/2003 | Cobbley et al. |
| 2003/0121957 | A1* | 7/2003 | Cobbley et al. ............. 228/245 |
| 2008/0217386 | A1* | 9/2008 | Iida et al. ..................... 228/246 |
| 2008/0301935 | A1* | 12/2008 | Iida et al. ....................... 29/843 |

FOREIGN PATENT DOCUMENTS

| JP | 02-102538 | 4/1990 |
| JP | 11-297886 | 10/1999 |
| JP | 2000-332043 | 11/2000 |
| JP | 2001-338942 | 12/2001 |

* cited by examiner

*Primary Examiner*—Thanh Nguyen
(74) *Attorney, Agent, or Firm*—Rankin, Hill & Clark LLP

(57) ABSTRACT

A method of mounting conductive balls on pads on a substrate includes: (a) placing the substrate having the pads coated with an adhesive over a container for containing the conductive balls therein and whose top surface is open such that the pads faces the top surface of the container; and (b) throwing up the conductive balls in the container by moving the container up and down at a given stroke, thereby allowing the conductive balls to adhere to the adhesive coated on the pads. Step (b) is repeatedly performed.

7 Claims, 4 Drawing Sheets

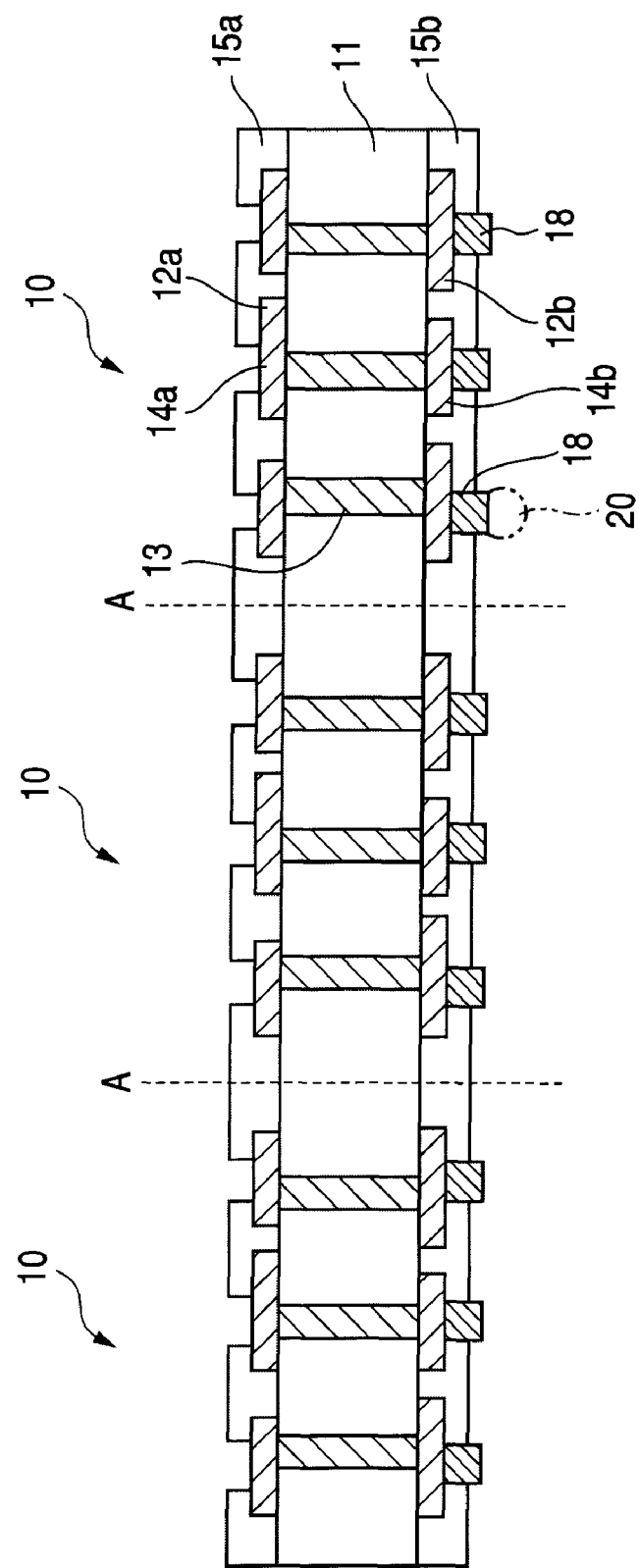

CONDUCTIVE BALL MOUNTING METHOD AND APPARATUS HAVING A MOVABLE SOLDER BALL CONTAINER

This application is based on and claims priority from Japanese Patent Applications Nos. 2007-187229, filed on Jul. 18, 2007, and 2008-179477 filed on Jul. 9, 2008, the entire contents of which are hereby incorporated by reference.

BACKGROUND

1. Technical Field

The present disclosure relates to a mounting method and apparatus for mounting conductive balls on a substrate. More particularly, the present disclosure relates to a mounting method and apparatus for mounting one conductive ball on each of a plurality of pads for external connection on a substrate (e.g., a wiring substrate, a package substrate, or a wafer).

2. Background Art

Upon forming solder bumps for connection with other electronic components on pads formed on a substrate such as a wiring substrate or a wafer, in the related art, solder paste is transferred on the pads by printing, and is formed into semispherical bumps by heating. In this method, as the pitch between the pads becomes narrower with an increase in density of electronic components, a short circuit caused by bridge between adjacent pads becomes remarkable. In forming bumps with a printing method, it is considered that the bump pitch has a limitation of about 200 μm.

With regard to formation of bumps at a narrower pitch, there is known a method utilizing solder balls each previously formed into a sphere. According to this method, for example, JP-A-11-297886 discloses the following steps. Firstly, a metal mask having through holes each receiving one solder ball at positions corresponding to each of the pads on a substrate is aligned with and overlapped on the substrate. Then, a large number of solder balls put on the mask are dropped into the through holes one by one. Then, the solder balls are allowed to adhere to the flux coated on the pads in advance. Then, excess solder balls on the mask are removed by a squeegee. Lastly, the mask is removed. As a result, solder balls are mounted on the substrate.

Meanwhile, the inventors of the present application developed a method for mounting solder balls on a substrate in the following manner, and filed a patent application as to the method (see U.S. patent application Ser. No. 12/042,916) According to this method, firstly, a metal mask having through holes each receiving one solder ball at positions corresponding to each of the pads is overlapped on a substrate. Then, with the solder ball mounting side of the substrate facing downward, a container in which the solder balls are contained is placed under the substrate. Then, by blowing air through the holes formed in the bottom of the container or by vibrating the container, the balls are moved up and allowed to pass through the respective through holes of the mask, and then are allowed to adhere to the flux coated on the pads in advance. Lastly, the mask is removed.

When the foregoing method in which balls are dropped one by one into respective through holes of the metal mask is used to mount conductive balls such as solder balls for forming bumps on a substrate with pads at a pitch as narrow as 200 μm or less, a step of arranging the balls on the pads by dropping and a step of removing the balls remaining on the mask are required to be performed in separate steps. This unfavorably results in a longer time required for the mounting step. Further, when the balls remaining on the mask are removed, the ball surface is likely to be damaged due to friction with the mask. Then, the balls become more likely to be oxidized, which unfavorably hinders reuse of the collected balls.

In using the method in which balls are moved up by blowing air, the balls are blown outside the container upon strengthening the power of blown air. Therefore, it is difficult to allow the balls to move up at a high density in one step. For this reason, in this case, an improvement of ball mounting rate is demanded.

In using the method in which balls are moved up with vibration, the balls are moved up uniformly. However, upon mounting the balls on a high density pad pattern, the balls cannot be supplied to the prescribed respective pads well because the moved up balls collide with each other. Furthermore, when the amount of the balls in the container is increased, the balls cease to move up.

Thus, in the related-art method for mounting conductive balls such as solder balls on a substrate with pads at a narrow pitch, it is very hard to simultaneously satisfy shortening of the mounting time, improvement of mounting rate, and simple reuse of the collected balls that are not mounted.

SUMMARY

It is an aspect of the present invention to provide a method and apparatus by which conductive balls can be mounted on a narrow-pitch pad on a substrate, which can simultaneously satisfy the above necessities.

According to one or more aspects of the present invention, in a method of mounting conductive balls on pads on a substrate, the method includes:

(a) placing the substrate having the pads coated with an adhesive over a container for containing the conductive balls therein and whose top surface is open such that the pads faces the top surface of the container; and (b) throwing up the conductive balls in the container by moving the container up and down at a given stroke, thereby allowing the conductive balls to adhere to the adhesive coated on the pads, wherein step (b) is repeatedly performed.

According to one or more aspects of the present invention, in step (b), the given stroke is set to 0.5 to 1000 mm.

According to one or more aspects of the present invention, step (b) is performed in 0.01 to 20 cycles per second.

According to one or more aspects of the present invention, a mask is used which has through holes each receiving one conductive ball at positions corresponding to each of the pads.

According to one or more aspects of the present invention, the mask is overlapped on a surface of the substrate on which the conductive balls are to be mounted.

According to one or more aspects of the present invention, the mask is provided on the top surface of the container.

According to one or more aspects of the present invention, in a conductive ball mounting apparatus for mounting conductive balls on pads on a substrate, the conductive ball mounting apparatus includes:

a container for containing the conductive balls therein and whose top surface is open;

a substrate holder for holding the substrate having the pads coated with an adhesive over the container such that the pads faces the top surface of the container; and a conductive ball throwing up apparatus for throwing up the conductive balls in the container by moving the container up and down at a given stroke so as to allow the conductive balls to adhere to the adhesive coated on the pads.

According to one or more aspects of the present invention, the conductive ball throwing up apparatus moves the container at a stroke of 0.5 to 1000 mm.

According to one or more aspects of the present invention, the conductive ball throwing up apparatus moves the container in 0.01 to 20 cycles per second.

Other aspects and advantages of the invention will be apparent from the following description, the drawings and the claims.

BRIEF DESCRIPTION OF THE DRAWINGS

The above and other aspects, features and advantages of the present invention will be more apparent from the following more particular description thereof, presented in conjunction with the following drawings wherein:

FIG. 1 is a schematic view illustrating an example of a substrate on which conductive balls are mounted;

DETAILED DESCRIPTION

Figure 2A:
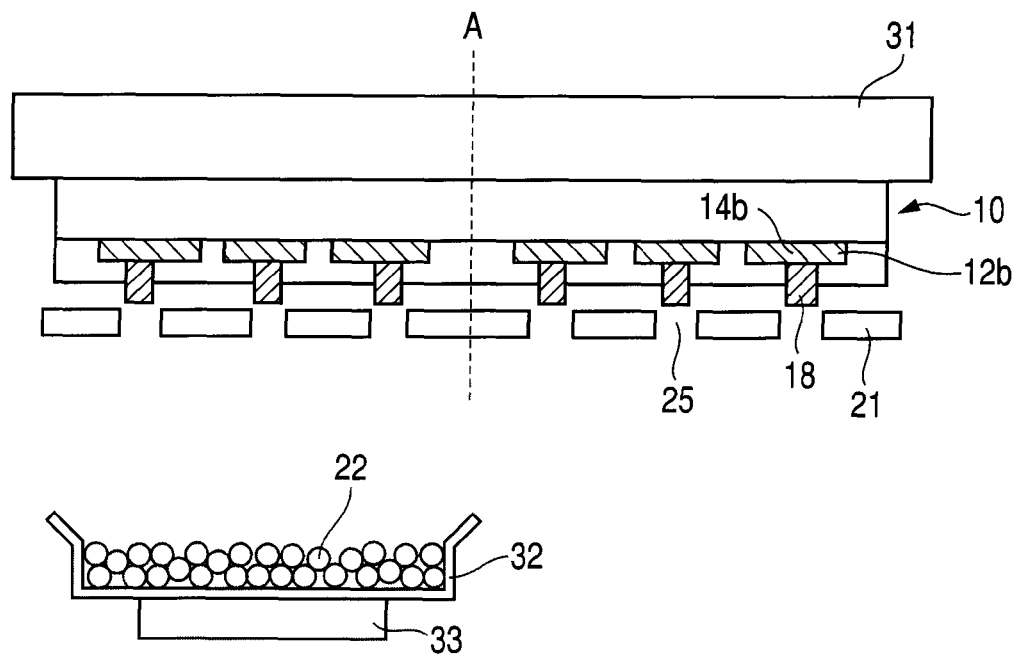
FIGS. 2A and 2B are schematic views illustrating a method of mounting conductive balls on a substrate according to an exemplary embodiment of the present invention.

Exemplary embodiments of the present invention will be described with reference to the drawings hereinafter.

According to exemplary embodiments of the present invention, conductive balls are thrown up from under to a substrate having pads coated with an adhesive such that the pads face downward. Then, the conductive balls are allowed to adhere to the adhesive, thereby to perform mounting the conductive balls on the substrate. As the adhesive, a flux, an adhesive and a conductive paste (e.g., solder paste) can be used. In the following description, a flux is used as one example of the adhesive.

Various substrates to be connected to external circuits by the use of bumps formed from the mounted conductive balls may be used as the substrates on which conductive balls are mounted. Examples of such substrates include a wiring substrate, a package substrate, and a wafer. Further, the package substrates include a ball grid array (BGA) package or the like.

The substrate has pads formed with a given pattern. On the top surfaces of the pads, a flux is coated. A pitch of the pad pattern is not limited. The present invention is applicable to even a pitch as narrow as 200 μm or less. For example, it is possible to mount conductive balls on a substrate with a pad pitch of about 100 to 200 μm with efficiency. The flux is selected according to the type of conductive balls to be mounted.

FIG. 1 shows one example of a substrate on which conductive balls are mounted according to exemplary embodiments of the present invention. The substrate shown in FIG. 1 is manufactured as an assembly of a plurality of (three in this figure) individual substrates 10 to be separated from each other later. The individual substrates 10 are separated at the portions of broken lines indicated with "A" in the figure after mounting conductive balls thereon and heating (reflowing) the conductive balls. Each individual substrate 10 has an upper wiring 12a and a lower wiring 12b formed on an upper surface and a lower side of a core substrate 11. The upper wiring 12a and the lower wiring 12b are connected to each other through a via 13 penetrating through the core substrate 11. The upper wiring 12a and the lower wiring 12b include pads 14a and 14b for external connection, respectively. The upper wiring 12a and the lower wiring 12b are covered with solder resist layers 15a and 15b, respectively, except for the portions of the pads 14a and 14b. On the surface of each pad 14b on which a conductive ball is mounted, a flux 18 is coated.

While the typical example of the conductive ball to be mounted on the substrate is a solder ball, in the present invention, for example, the balls obtained by covering a core material of a resin with a solder material can also be used.

With reference to the figures, a description will be given to a method of mounting conductive balls on a substrate according to exemplary embodiments of the present invention. Herein, a description will be given to an example in which conductive balls are mounted on one side of the substrate including wirings formed on both sides thereof, as described previously with reference to FIG. 1. In the figures referred below, for simplification, only the wiring 12b and the pad 14b formed on the ball-mounting side (lower side), the solder resist layer 15b, and the flux 18 on the pad 14b are shown, and other members are not shown. Further, in the figures referred in the following description, there is shown a substrate having two individual substrates to be separated from each other after mounting conductive balls thereon.

As shown in FIG. 2A, a mask 21 having through holes 25 each receiving one conductive ball at positions corresponding to the respective pads 14b is aligned with and overlapped on a substrate where two individual substrates 10 are integrated together. The substrate is held by a substrate holder 31 such that a side of the mask 21 on which the mask 21 is overlapped faces downwardly. The substrate holder 31 can hold the substrate from above with chucking or mechanical holding means (e.g., a cramp).

The substrate held by the substrate holder 31 is placed over a container 32 for containing conductive balls 22 and whose top surface is open. The container 32 is configured such that the opening area corresponds to the area of one individual substrate 10. Thus, it is configured so as to mount the conductive balls on each of the individual substrate 10. However, it can also be configured so as to mount the balls on a plurality of individual substrates, or all the individual substrates of the assembly at the same time.

The container 32 supplies the balls 22 such that the balls 22 adhere to the flux 18 on the surfaces of the pads 12b of the individual substrate 10. Thus, the container 32 is coupled to a throwing up apparatus 33 for throwing up the balls 22.

Figure 2B:
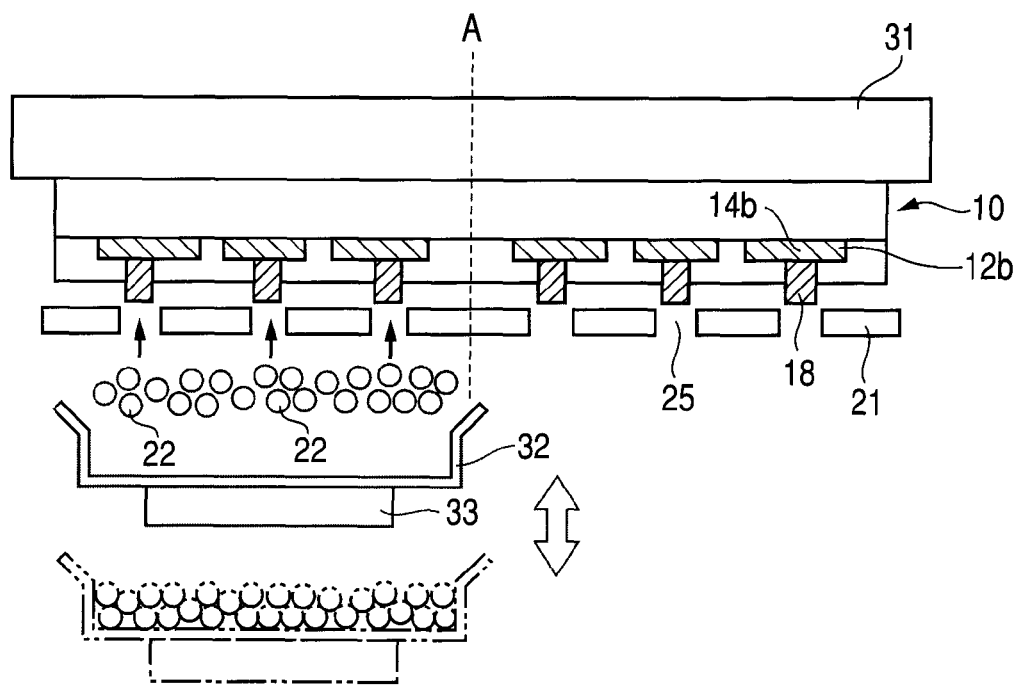

Then, as shown in FIG. 2B, the container 32 rises suddenly by activating the throwing up apparatus 33. When the container 32 reaches the upper end of the throwing stroke, the balls 22 are thrown from the container 32 upwardly. A part of the thrown balls 22 enter the through holes 25 of the mask 21, and then adhere to the flux 18. The throwing up apparatus 33 shifts to a descending operation, so that the container 32 moves down. The balls 22 which have not adhered to the flux 18 drop and return into the container 32. This operation is repeatedly performed until the balls 22 enter all the through holes 25 and adhere to the flux 18. Subsequently, for another individual substrate 10, likewise, the step of throwing up the balls is repeatedly performed until the balls 22 enter all the through holes 25, and adhere to the flux 18.

Further, step of mounting the balls 22 is performed at the temperature below the melting point of the balls 22 (usually, at room temperature). The substrate holder 31, the container 32, and the throwing up apparatus 33 in the conductive ball mounting apparatus can be placed in the atmosphere. Also, the conductive ball mounting might be placed under reduced pressure or under an inert gas atmosphere. This prevents dusts from attaching the substrate, and also prevents the pads or the conductive balls from being oxidized.

In order to buffer the impact shock of the balls 22 to the substrate 10, the substrate holder 31 for holding the substrate might be caused to move up and down according to a motion in which the balls 22 are thrown up by the throwing up apparatus 33. This prevents the substrate 10 or the conductive balls from being broken. While, in FIGS. 2A and 2B, only one throwing up apparatus 33 is shown, the exemplary embodiments of the present invention are not limited thereto. For example, a plurality of the throwing up apparatus 33 might be provided for one substrate 10, to throw up the balls 22 one after the other. Thus, it is possible to increase manufacturing efficiency.

Figure 3:
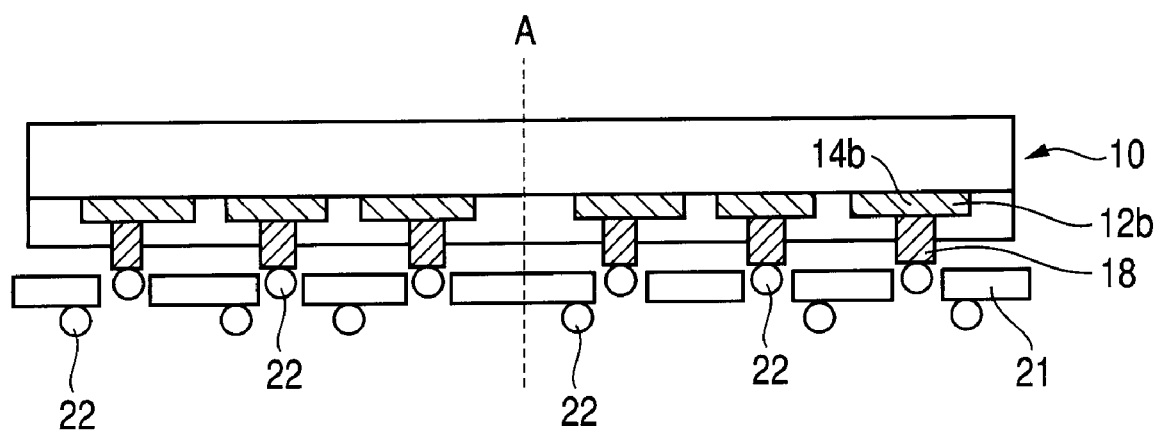
FIG. 3 is a schematic view illustrating the balls remaining on a mask after mounting the conductive balls.

In the step of mounting conductive ball by throwing up, the balls 22 which have not adhered to the flux 18 drop and return to the container 32. However, a part of the balls 22 may remain on the mask 21 as shown in FIG. 3. Also, a part of the balls 22 may adhere to and remain on the substrate 10. The balls 22 remaining on the mask 21 or on the substrate 10 can be removed collectively after completion of mounting of the balls on all the individual substrates 10. As a removing method, methods can be used in which the balls on the mask are blown off with spraying air, chucked by a chucking head or brushed off by a brush. Alternatively, the balls 22 remaining on the mask 21 or on the substrate 10 can be removed by applying impact shock onto any of the substrate holder 31 (FIGS. 2A and 2B), the substrate 10, and the mask 21 to drop down the balls 22.

The throwing up apparatus 33 throws up the conductive balls by moving the container 32 up and down at a given stroke, and enables throwing up of balls by using a cam mechanism or a cylinder capable of piston movement, for example. If the stroke of the throwing up apparatus 33 which moves the container 32 to throw up the balls is set to be long, manufacturing efficiency is decreased because of long operating time. Meanwhile, if the stroke is set to be short, it is hard to throw up the balls at an enough height. Therefore, the stroke can be set to, for example 0.5 to 1000 mm. If preferable, the stroke can be set to 10 to 50 mm. If the cycle of the throwing up operation of the throwing up apparatus 33 is set to be long, manufacturing efficiency is decreased because of long operation time. Meanwhile, if the cycle is set to be short, device load (power) is increased. Therefore, the cycle can be set to, for example, 0.01 to 20 (0.01 Hz to 20 Hz) per second. If preferable, the cycle can be set to 0.1 to 10 (0.1 Hz to 10 Hz) per second. By such a throwing up operation, it is possible to supply the balls 22 in the container 32 collectively toward the substrate. For this reason, even on a substrate on which pads are formed with a high density pattern, conductive balls can be mounted for a short time.

In contrast, when balls are moved up by vibrating the container for containing balls therein to be mounted on the substrate as disclosed in U.S. patent application Ser. No. 12/042,916, in general, the cycle of vibration is set about 100 to 150 Hz, and the amplitude thereof is set to less than 150 μm. The balls are allowed to move randomly and move up uniformly. However, collision between the moved up balls occurs. Accordingly, with a high density pad pattern, it becomes difficult to supply balls on prescribed pads well. Further, when the amount of balls in the container is increased, it becomes impossible to move up the balls.

Figure 4A:
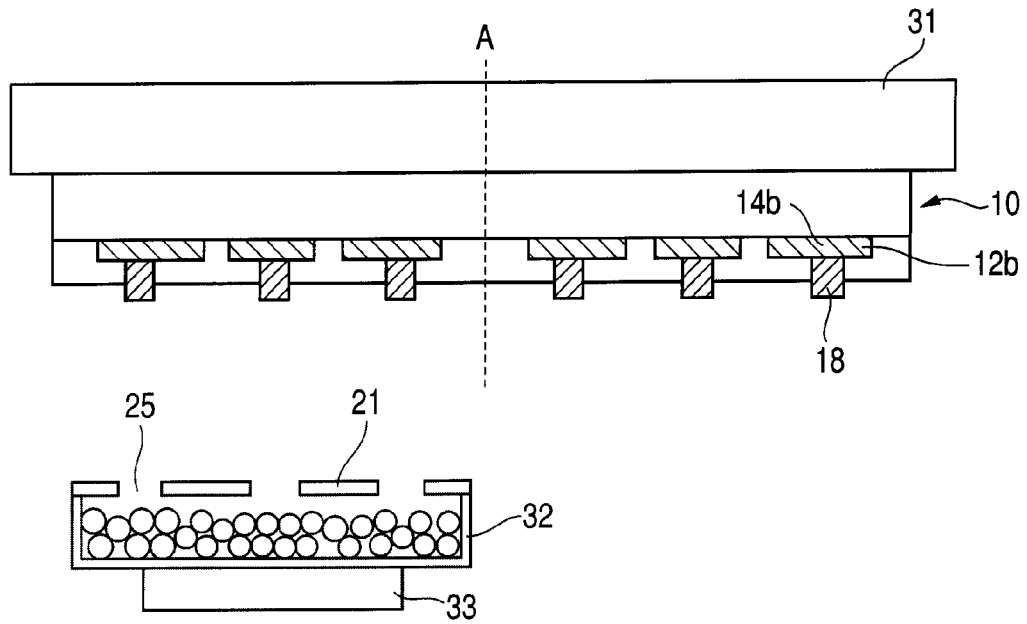
FIGS. 4A and 4B are schematic views illustrating another method of mounting conductive balls on a substrate according to an exemplary embodiment of the present invention.
Figure 4B:
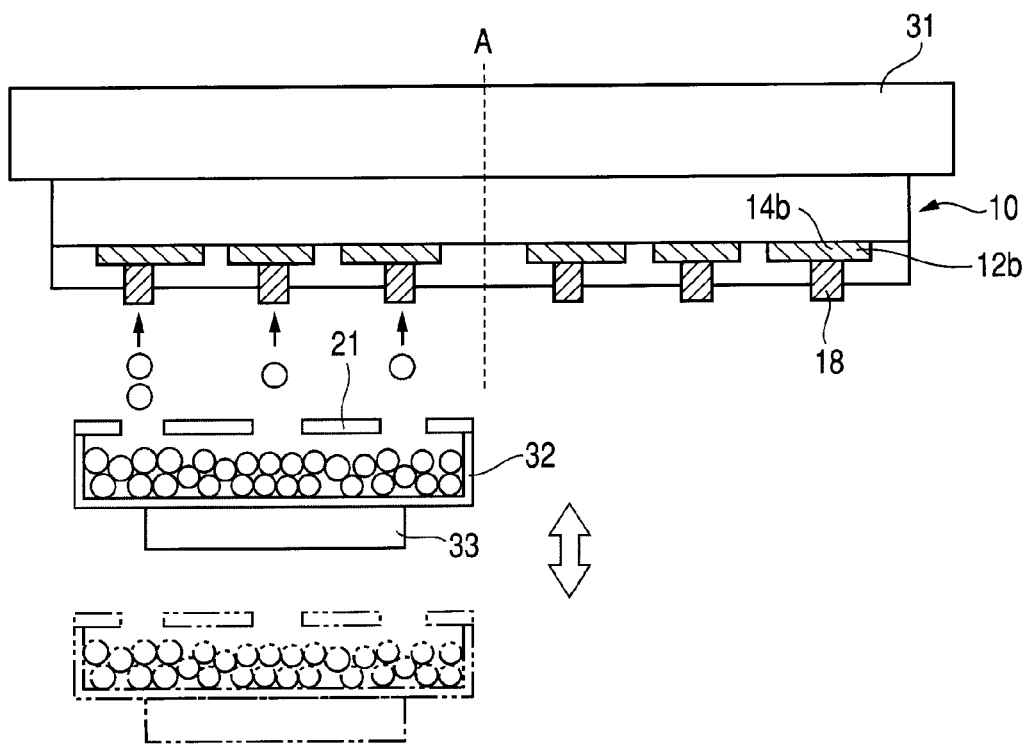

In the example previously described, for the purpose of more ensuring that the thrown balls 22 adhere to the flux 18 of respective pads 14b, the mask 21 having through holes 25 each receiving one conductive ball at positions corresponding to the respective pads 14b is aligned with and overlapped on the substrate for use. The mask might be provided away from the substrate 10. In this case, in order to prevent a displacement of the mask 21 relative to the substrate 10, the mask 21 needs to be fixed to the substrate 10 or the substrate holder 31 (FIGS. 2A and 2B). In some cases, such a mask can also be provided on the container 32 side. As shown in FIGS. 4A and 4B, the conductive balls are mounted on the substrate 10 using the container 32 having the mask 21 provided thereon. Alternatively, the use of the mask may also be omitted.

After the step of mounting the balls on the substrate, the substrate on which the balls are mounted is taken out from the conductive ball mounting apparatus, and then reflow process is performed on the balls. The balls are melted and fixed to the pads by heating the balls (reflow process).

Exemplary embodiments of the present invention will be further described by the following examples.

Comparative Example

On a wiring substrate on which 4000 pads (those coated with a flux) with a diameter of 90 μm are provided at a pitch of 150 μm, three types of Sn/Ag solder balls with diameters of 60 μm, 80 μm, and 100 μm were mounted using the method in which balls are moved up with vibration, and then mounted on a substrate as described in U.S. patent application Ser. No. 12/042,916. Upon mounting, according to respective diameters of the solder balls, masks with opening diameters of 80 μm, 100 μm, and 120 μm were overlapped on the mounting side of the substrate. A container for containing the solder balls were vibrated at 100 Hz and an amplitude of 100 μm for 10 seconds, and the balls were mounted on the substrate. Then, the number of pads on which no balls have been mounted (in which no balls have adhered to the flux) was examined.

Example

The same experiment as Comparative Example was repeated, except that the solder balls were thrown up to be mounted on a substrate in accordance with the invention. Throwing up operation of the solder balls was carried out at two cycles (2 Hz) per second, and at a stroke of 20 mm. The time required for throwing up was 10 seconds as with Comparative Example.

The results of Comparative Example and Example are shown in Table 1.

TABLE 1

|  |  | Ball diameter | | |
| --- | --- | --- | --- | --- |
|  |  | 60 μm | 80 μm | 100 μm |
|  |  | Mask opening diameter | | |
|  |  | 80 μm | 100 μm | 120 μm |
| Number of pads including no balls mounted thereon | Comparative Example | 45 | 33 | 43 |
|  | Example | 0 | 0 | 0 |

As apparent from these results, in accordance with the invention, it is possible to mount conductive balls on a substrate for a short time and with reliability.

According to exemplary embodiments of the present invention, it is possible to mount conductive balls on a substrate for a short time, and at an improved mounting rate. Further, in cases where a mask is used for mounting the balls, even when some balls adhere to and remain on the substrate, the balls adhere to the underside of the mask. Therefore, the balls can be removed easily, and can be reused (In the related-art method in which the balls are dropped into the through holes of the metal mask to be mounted, the balls are collected by scratching the upper side of the mask. Therefore, the upper surface is likely to be damaged, and is likely to be oxidized at the damaged sites, which causes hindrance in reuse of the collected balls).

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A method of mounting conductive balls on pads on a substrate, the method comprising:
   (a) placing the substrate having the pads coated with an adhesive over a container for containing the conductive balls therein and whose top surface is open such that the pads face the top surface of the container; and
   (b) repeatedly moving the container in an up and down motion at a given stroke, such that the conductive balls are thrown from the container toward the substrate thereby allowing the conductive balls to adhere to the adhesive coated on the pads.

2. The method according to claim 1, wherein in step (b), the given stroke is set to 0.5 to 1000 mm.

3. The method according to claim 1, wherein step (b) is performed in 0.01 to 20 cycles per second.

4. The method according to claim 1, wherein a mask is used which has through holes each receiving one conductive ball at positions corresponding to each of the pads.

5. The method according to claim 4, wherein the mask is overlapped on a surface of the substrate on which the conductive balls are to be mounted.

6. The method according to claim 4, wherein the mask is provided on the top surface of the container.

7. The method according to claim 1, wherein the substrate moves repeatedly in an up and down motion according to the motion of the container.

* * * * *